United States Patent
Adel et al.

(10) Patent No.: US 8,214,771 B2
(45) Date of Patent: Jul. 3, 2012

(54) SCATTEROMETRY METROLOGY TARGET DESIGN OPTIMIZATION

(75) Inventors: Michael Adel, Zirchon Yaakov (IL); Amnon Manassen, Haifa (IL); Daniel Kandel, Aseret (IL)

(73) Assignee: KLA-Tencor Corporation, San Jose, CA (US)

( * ) Notice: Subject to any disclaimer, the term of this patent is extended or adjusted under 35 U.S.C. 154(b) by 544 days.

(21) Appl. No.: 12/350,826

(22) Filed: Jan. 8, 2009

(65) Prior Publication Data

US 2010/0175033 A1    Jul. 8, 2010

(51) Int. Cl.
G06F 17/50 (2006.01)
G06F 17/10 (2006.01)
G01B 11/14 (2006.01)

(52) U.S. Cl. .............. 716/52; 716/51; 716/54; 356/625; 703/2

(58) Field of Classification Search .................. None
See application file for complete search history.

(56) References Cited

U.S. PATENT DOCUMENTS

| | | | |
|---|---|---|---|
| 5,166,752 A | 11/1992 | Spanier et al. | |
| 5,181,080 A | 1/1993 | Fanton et al. | |
| 5,821,015 A | 10/1998 | Sugawara | |
| 6,130,750 A | 10/2000 | Ausschnit et al. | |
| 6,248,602 B1 | 6/2001 | Bode et al. | |
| 6,507,931 B2 | 1/2003 | Kotani et al. | |
| 6,581,193 B1 | 6/2003 | McGhee et al. | |
| 6,886,153 B1 | 4/2005 | Bevis | |
| 6,995,842 B2 | 2/2006 | Opsal | |
| 7,266,480 B2 * | 9/2007 | Adam ............................ | 703/2 |
| 7,346,878 B1 * | 3/2008 | Cohen et al. ................... | 716/55 |
| 7,480,050 B2 | 1/2009 | Den Boef et al. | |
| 7,557,921 B1 * | 7/2009 | Adel et al. ..................... | 356/401 |
| 7,608,468 B1 * | 10/2009 | Ghinovker et al. ............. | 438/16 |
| 7,712,056 B2 * | 5/2010 | White et al. ................... | 716/136 |
| 2004/0017575 A1 | 1/2004 | Balasubramanian et al. | |
| 2004/0181768 A1 | 9/2004 | Krukar | |
| 2004/0216065 A1 | 10/2004 | Cobb et al. | |
| 2005/0010890 A1 | 1/2005 | Nehmadi et al. | |

(Continued)

FOREIGN PATENT DOCUMENTS

KR    10-20020002323    1/2002

(Continued)

OTHER PUBLICATIONS

U.S. Appl. No. 60/782,075, filed Mar. 14, 2006.

(Continued)

*Primary Examiner* — Leigh Garbowski
*Assistant Examiner* — A. M. Thompson
(74) *Attorney, Agent, or Firm* — Joshua D. Isenberg; JDI Patent

(57) ABSTRACT

A metrology target design may be optimized using inputs including metrology target design information, substrate information, process information, and metrology system information. Acquisition of a metrology signal with a metrology system may be modeled using the inputs to generate one or more optical characteristics of the metrology target. A metrology algorithm may be applied to the characteristics to determine a predicted accuracy and precision of measurements of the metrology target made by the metrology system. Part of the information relating to the metrology target design may be modified and the signal modeling and metrology algorithm may be repeated to optimize the accuracy and precision of the one or more measurements. The metrology target design may be displayed or stored after the accuracy and precision are optimized.

25 Claims, 5 Drawing Sheets

U.S. PATENT DOCUMENTS

| | | |
|---|---|---|
| 2005/0071038 A1 | 3/2005 | Strang |
| 2005/0173634 A1 | 8/2005 | Wong et al. |
| 2006/0012763 A1 | 1/2006 | Hinnen et al. |
| 2006/0024850 A1 | 2/2006 | Monahan et al. |
| 2006/0062445 A1 | 3/2006 | Verma et al. |
| 2006/0095208 A1 | 5/2006 | Hirscher et al. |
| 2006/0189009 A1 | 8/2006 | Ahn et al. |
| 2006/0194382 A1 | 8/2006 | Hayashi |
| 2007/0050749 A1 | 3/2007 | Ye et al. |
| 2007/0276634 A1 | 11/2007 | Smith et al. |

FOREIGN PATENT DOCUMENTS

| | | | |
|---|---|---|---|
| KR | 2002-0002323 A | * | 1/2002 |
| KR | 20020002323 | | 1/2002 |
| KR | 10-20060093912 | | 8/2006 |
| KR | 10-20060093912 A | * | 8/2006 |
| KR | 20060093912 | | 8/2006 |
| WO | WO 03/043075 | | 5/2003 |

OTHER PUBLICATIONS

The International Search Report and the Written Opinion of the International Searching Authority dated Aug. 9, 2010 issued for the International application No. PCT/US2010/020046.

Advisory Action dated Oct. 13, 2010 issued for U.S. Appl. No. 11/685,501.

Final Office Action dated Jul. 6, 2010 issued for U.S. Appl. No. 11/685,501.

Office Action Action dated Jan. 4, 2010 issued for U.S. Appl. No. 11/685,501.

Office Action dated Jun. 24, 2009 issued for U.S. Appl. No. 11/685,501.

Office Action dated Nov. 7, 2008 issued for U.S. Appl. No. 11/685,501.

Advisory Action dated Jul. 18, 2008 issued for U.S. Appl. No. 11/685,501.

Final Office Action dated May 13, 2008 issued for U.S. Appl. No. 11/685,501.

Office Action dated Nov. 15, 2007 issued for U.S. Appl. No. 11/685,501.

Extended European Search Report for European Patent Application No. 07758540.4 mailed Feb. 25, 2010.

U.S. Appl. No. 11/745,173, filed May 7, 2007.

U.S. Appl. No. 60/729,268, filed Oct. 21, 2005.

U.S. Appl. No. 10/858,836, filed Jun. 1, 2004.

U.S. Appl. No. 11/154,310, filed Jun. 16, 2005.

International Preliminary Report on Patentability for International Application No. PCT/US2010/020046 dated Jul. 21, 2011.

* cited by examiner

SCATTEROMETRY METROLOGY TARGET DESIGN OPTIMIZATION

FIELD OF THE INVENTION

This invention generally relates to semiconductor fabrication and more particularly to the use of interferometry in measuring the shape and thickness variation of a semiconductor substrate.

BACKGROUND OF THE INVENTION

As the components of semiconductor devices shrink to smaller and smaller sizes, now on the order of nanometers, the ability to improve metrology performance, productivity, and device correlation becomes ever so important. To determine the alignment of features formed in one layer with respect to features formed in a previous or subsequent layer, metrology targets are often formed in one or more of the layers. The metrology targets facilitate measurement of the dimensions of features and alignment, e.g., overlay, between the features using a metrology tool such as a critical dimension (CD) scanning electron microscope (SEM) or scatterometer. In the past, metrology target optimization was performed experimentally by trial and error, and by "rules of thumb" based on prior experience. Currently, metrology engineers work with GDS metrology target libraries or collaborate with layout engineers to modify generic target designs based on known rules of thumb in order to do a best effort to make metrology structures compatible lithographic design rules, process constraints and metrology performance considerations.

Unfortunately, in a trial and error approach each trial represents a new reticle and a set of experiments with the new reticle to test the performance of the target. This is often a time consuming approach. It can sometimes take up two or three mask design iterations until the design is satisfactory. Consequently, trial and error based design tends to be slow and costly. In addition "rules of thumb" are often considered intellectual property, so widespread dissemination of the rules themselves may not possible. Furthermore, the conventional approach requires technical inputs from a number of different domain experts who are not always available to support the metrology engineer. Furthermore, such an approach can result in target designs which are suboptimal in the area of lithography compatibility, process compatibility or metrology compatibility. Consequently, lack of new target adoption and/or suboptimal targets were often the result of this approach.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to an embodiment of the present invention a piece of software (or two or more pieces of interacting software) may be used to optimize a metrology target structure that can be output in a standard format. By way of example, and not by way of limitation, the standard format may be GDS II stream format, commonly referred to by the acronym GDSII, which is a database file format that is an industry standard for data exchange of integrated circuit or IC layout artwork. GDSII is a binary file format representing planar geometric shapes, text labels, and other information about the layout in hierarchical form. The data can be used to reconstruct all or part of the artwork to be used in sharing layouts, transferring artwork between different tools, or creating photomasks.

The metrology target structure represents a pattern of a metrology target to be formed on one or more layers of material during fabrication of a device on a substrate. By way of example, and not by way of limitation, the metrology target may be formed in the one or more layers, e.g., by photolithograph using a reticle. Alternatively, the metrology target may be formed in the one or more layers using a maskless technique, e.g., electron beam lithography. An additional result of the process may be an optimized metrology recipe in lieu of metrology performance simulation data. Also, dependencies of the metrology signal on optical characteristics may be supplied. These dependencies may be used as "knobs" for achieving metrology fleet matching.

As a specific example, the case of optimizing a target for scatterometry overlay is described below. However, this is not meant to be an example of how a metrology target may be optimized and is not intended as a limitation on any embodiment of the invention.

Figure 1A:
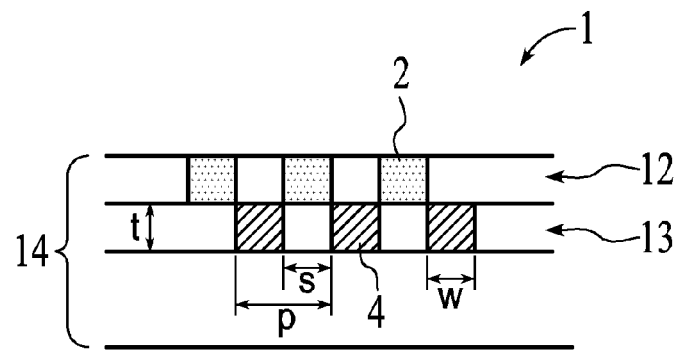
FIG. 1A is a side view of a scatterometry metrology target according to the prior art.
Figure 1B:
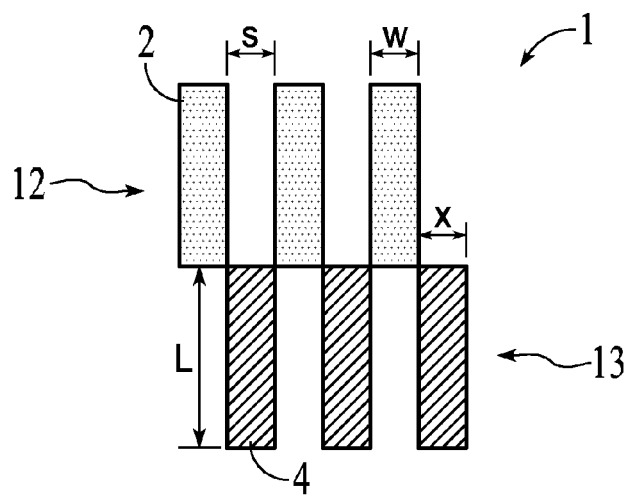
FIG. 1B is a top plan view of the scatterometry metrology target of FIG. 1A.

FIGS. 1A-1B illustrate an example of a metrology target 1 that may be used for differential scatterometry overlay. By way of example, and not by way of limitation, the target 1 may include a plurality of spaced apart lines 2, 4 formed in one or more thin film layers 12, 13 of material formed or overlaid on a sample 14. The target may include lines formed in different layers as structures are formed in those layers during a thin film device fabrication process, such as a deposition process or an etch process. The lines 2, 4 formed in different layers 12, 13 may be interlaced and offset laterally with respect to each other. Each set of lines 2, 4 may be characterized by a number of design parameters. These parameters may include, for example, the layer in which the set of lines is formed, a number of lines in the set, a line length L, a line width w a line spacing s, a pitch p, an offset x, and a line thickness t. The overlay error between the two sets of lines 2, 4 may be determined by analyzing light scattered from the two sets of lines.

Metrology targets often include two or more sets of lines of the type shown in FIGS. 1A-1B organized in cells. Different cells may have lines that run in different, e.g., mutually perpendicular directions.

Figure 1C:
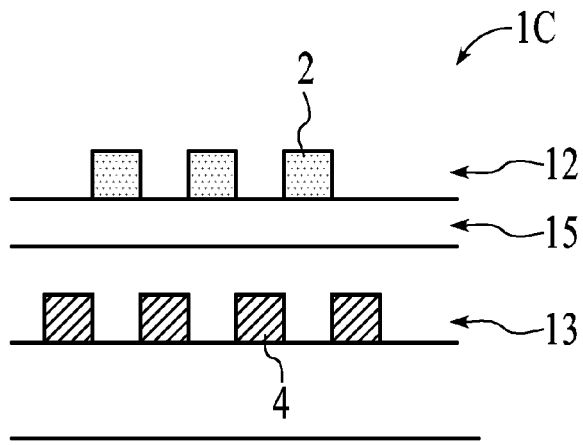
FIG. 1C is a side view of a scatterometry metrology target having an overlying layer that does not exhibit residual topography.
Figure 1D:
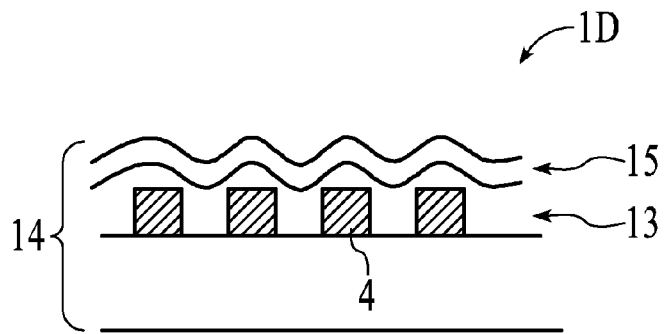
FIG. 1D is a side view of a scatterometry metrology target having an overlying layer that exhibits residual topography.

In some cases, a metrology target, or a portion thereof, may have a layer of material formed over one or more of the sets of lines. Such a layer of material may or may not exhibit residual topography. As used herein, residual topography refers to parameters determined from topography observable in a layer overlying a structure that is due to the structure that underlies the layer. By way of example, FIG. 1C illustrates a target 1C in which a layer of material 13 is formed over a set of lines 4. The layer is planarized and covered with a subsequent layer 15. If either or both layers 13, 15 are opaque, the underlying structure of the lines 4 is not observable. In FIG. 1D, by contrast, the layer 13 of the target ID is not planarized, as a result, the layers 13, 15 exhibit residual topography due to the lines 4. Such residual topography may be observed, even if one or both of the layers 13, 15 are opaque. Parameters of the structure of the lines 4, e.g., pitch, height, spacing, width, length, offset and the like, may be determined from observations of the residual topography.

Figure 1E:
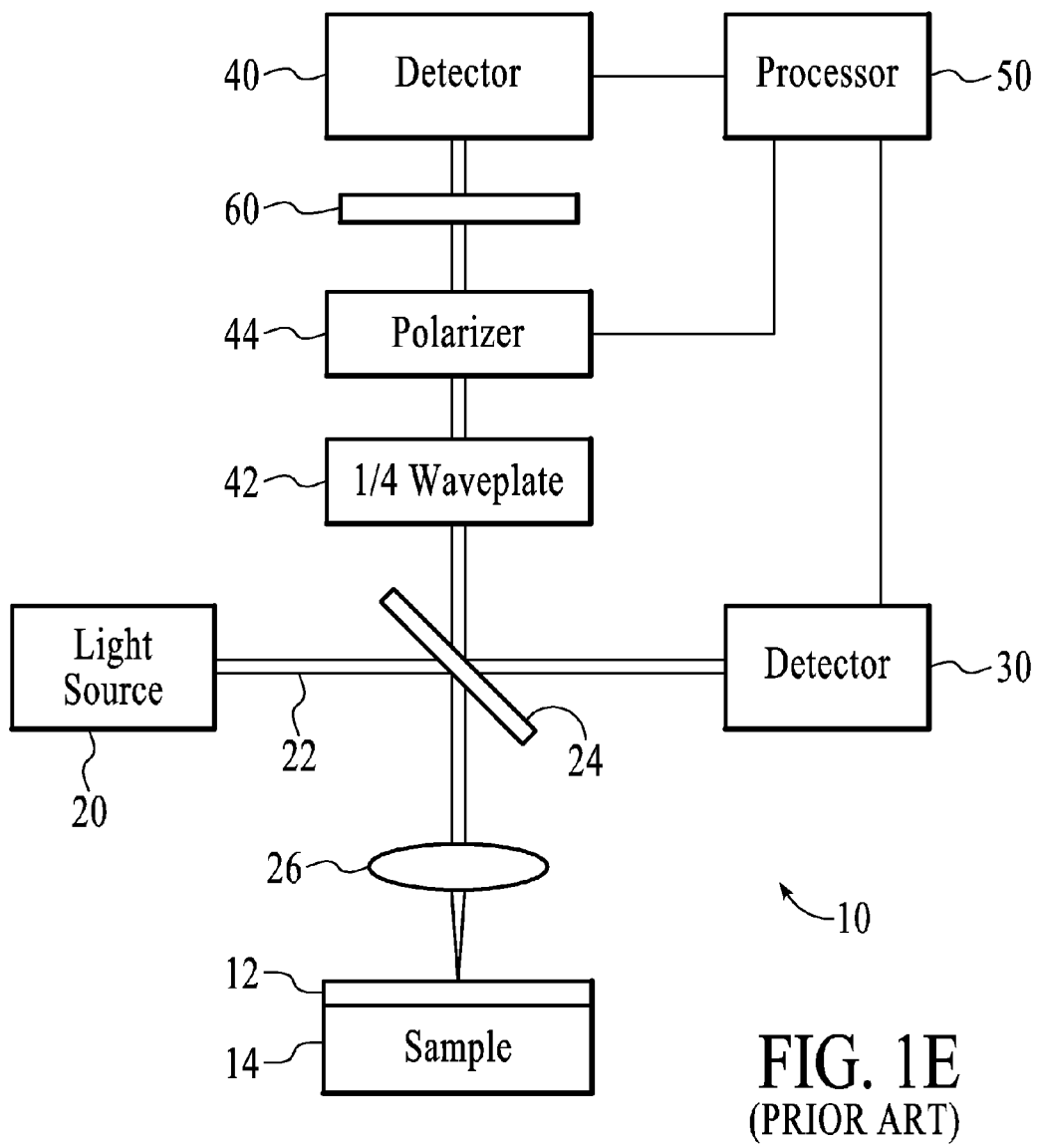
FIG. 1E is a schematic diagram of a metrology system according to the prior art.

An example of an apparatus 10 that may be used for scatterometry overlay metrology with a target of the type shown in FIGS. 1A-1B is shown in FIG. 1E. A full description of this apparatus may be found in U.S. Pat. No. 6,995,842, which is incorporated herein by reference in its entirety. The apparatus 10 may be designed to evaluate characteristics at the surface of a sample 14, such as thin film layers 12 and/or structural features such as critical dimensions.

The apparatus 10 may include a light source 20 for generating a probe beam 22 of radiation. One suitable light source is a solid state laser diode which emits a linearly polarized beam having a stable, known and relatively narrow bandwidth. Probe beam 22 is turned towards the sample 14 with a 50/50 beam splitter 24. The probe beam is focused onto the surface of the sample with an objective 26. By way of example, and not by way of limitation, the objective 26 may be a spherical, microscope objective with a high numerical aperture, e.g., of about 0.90 NA. The high numerical aperture functions to create a large spread of angles of incidence with respect to the sample surface. The spot size is on the order of twenty microns or less and is preferably five microns or less in diameter.

In should be noted that in this illustrated example, the beam is directed substantially normal to the surface of the sample prior to being focused by lens 26. This configuration helps minimize the spot size on the sample. It is within the scope of the subject invention to direct the beam at a non-normal angle of incidence to the sample as shown in U.S. Pat. No. 5,166, 752, which is incorporated herein by reference. Although using an off-axis beam increases the spot size on the sample, high angles of incidence can be created with a lower numerical aperture lens.

Turning back to FIG. 1E, a fraction of the probe beam power also passes through splitter 24 and falls on an incident power detector 30. As is well known to those skilled in the art, incident power detector 30 is provided to monitor fluctuations in the output power of the probe beam light source. As discussed in U.S. Pat. No. 5,181,080, which is incorporated herein by reference, the incident power detector may be modified to minimize measurement errors which arise due to asymmetries of the beam.

Light reflected from the target 1 formed on one or more layers of the sample 14 passes up through splitter 24 towards a photodetector 40. An output of the detector 40 may be supplied to a processor 50 for evaluation. Prior to reaching detector 40, the beam 22 passes through a quarter-wave plate 42 for retarding the phase of one of the polarization states of the beam by 90 degrees. It should be noted that the quarter-wave plate 42 may alternatively be located in the beam path prior to the probe beam striking the sample so that the system would operate with circularly polarized light. The latter approach might have some advantages in reducing the aberrations created by lens 26. In addition, while a phase retardation of 90 degrees will maximize the desired signal; other intermediate levels of retardation may be possible.

The detector 40 may be configured to generate independent signals from regions along two pairs of mutually orthogonal axes. By way of example, this goal may be achieved by using a photodetector having a plurality of spaced-apart light sensitive elements, e.g., photodiodes, photoresistors, or photovoltaic devices, each of which produces a distinct signal in response to radiation incident upon it. By way of example, the light-sensitive elements may be configured in the form of a circle divided into multiple (e.g., eight) wedge shaped segments. In such a case, the probe beam 22 is preferably centered on the detector 40 so that each segment intercepts an equal portion of the probe beam. It may also be desirable that the probe beam should underfill the detector 40. Each segment may generate an output signal proportional to the magnitude of the power of probe beam striking that segment. This signal represents an integration of the intensities of all the rays having different angles of incidence with respect to the sample surface. While this integration approach results in the loss of some information content as compared to an analysis of individual rays, the composite approach can provide significantly greater sensitivity through enhanced signal to noise performance.

The output of the segments is supplied to the processor 50 for evaluation. As in the prior art, the outputs of all the segments can be summed to provide a measure of the full power of the reflected beam. As discussed in U.S. Pat. No. 6,695,842, this full power measurement may be used as an input to a regression analysis to determine the characteristics of the sample. The processor 50 may also generate measurements which allow additional ellipsometric information to be derived as compared to the prior art approach. By way of example, the processor 50 may analyze the output of the detector to determine an overlay error between the two sets of lines 2, 4 in the metrology target 1.

If it is desired to extend this concept to measure multiple wavelengths, the light source 20 may be a white light source that would generate a polychromatic probe beam. If such a light source is used, a wavelength selective filter 60 (shown in phantom line in FIG. 1E) may be placed somewhere in the light path between the light source 20 and the detector 40. By way of example, the filter 60 may take the form of one or more simple band pass (color) filters that may be selectively moved into the path of the beam. Alternatively, a monochromator may be used to sequentially select narrow wavelength regions. Of course a tunable laser or multiple lasers with different wavelengths may also be used.

Figure 2:
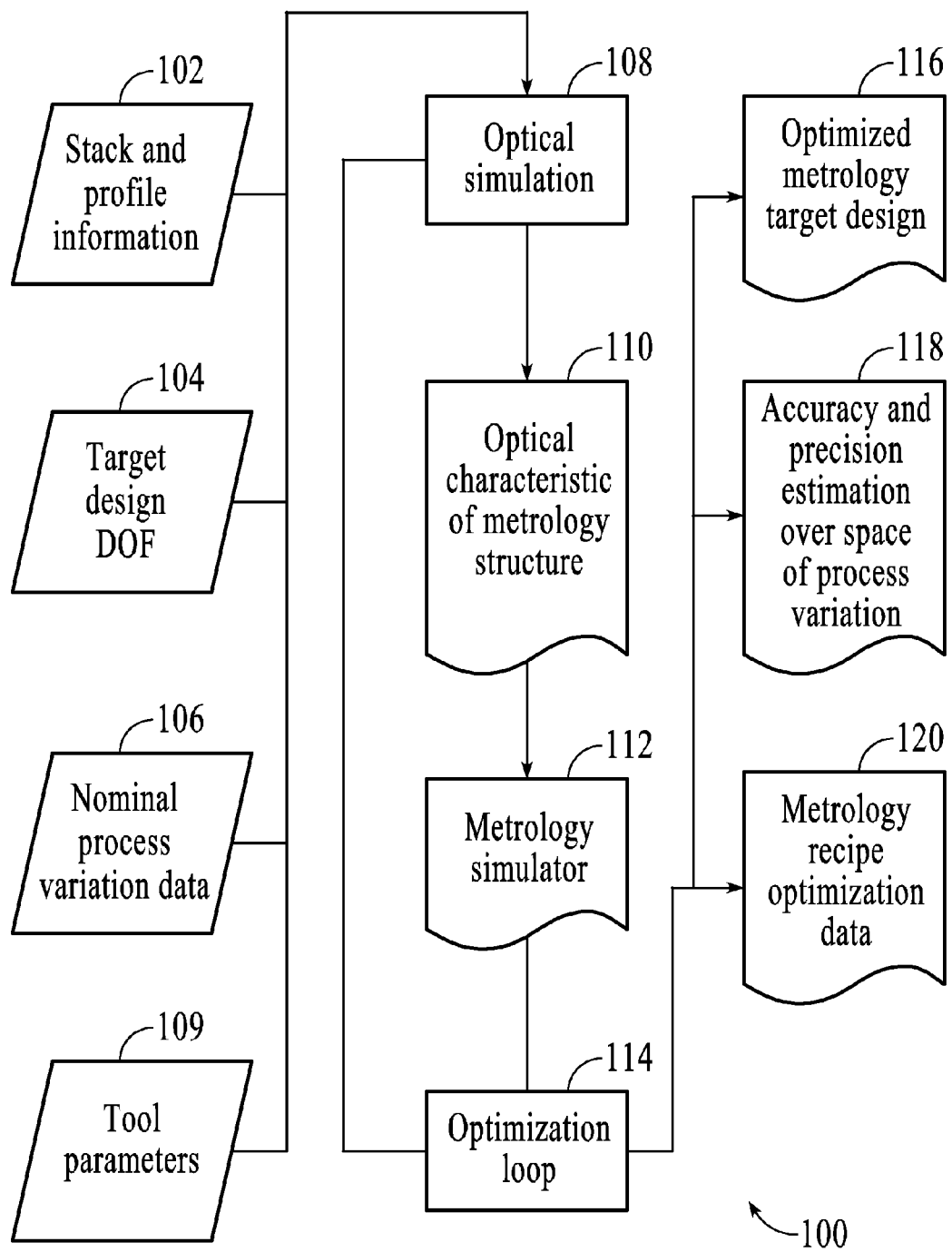
FIG. 2 is a block diagram illustrating information flow in optimizing a metrology target in accordance with an embodiment of the present invention.

According to embodiments of the present invention, the design parameters that characterize the metrology target 1 may be optimized in a systematic way before the target is fabricated. FIG. 2 depicts an example of the information flow used by an apparatus 100 to optimize a metrology target design. This information flow may be implemented, e.g., by a general purpose computer programmed to implement an optimization process. Alternatively, specialized hardware may be configured to implement the optimization process.

The metrology target design utilizes a number of inputs related to the layer or layers 12, 13 in which the target 1 is to be formed, the process used to form structures in those layers and the metrology target itself. These inputs may include, but are not limited to stack and profile information 102 related to the layers 12, 13, target design degrees of freedom 104 related to the target 1, and nominal process variation data 106 related to the process used to form the structures and the target 1.

By way of example, the stack and profile information 102 may include, but is not limited to the type and/or optical characteristics of the material that makes up the layers 12, 13, and the thickness of each of these layers. Examples of such stack and profile information includes, but is not limited to film thickness, wavelength dependent refractive index $n(\lambda)$, dielectric constant $k(\lambda)$ and residual topography.

By way of example, but not limitation, the target design degrees of freedom 104 may include values of target design parameters, such as the number of lines 2, 4, the length L, width w, and thickness t of each of the lines 2, 4, the spacing s between adjacent lines, the properties of the material that makes up the lines and an offset between the two sets of lines 2, 4. The target design degrees of freedom nominal values of these parameters as well as any upper and/or lower limits on these values, if the values can be varied between these limits. Another possible degree of freedom is the size of cells in a target or the layout of the cells in a target.

By way of non-limiting example, the nominal process variation data 106 may include information relating to variation in the target design parameters resulting from the process used to form structures that make up the target, e.g., lines 2, 4 in target 1. Such information may be determined from experimental data that compares nominal design values for target parameters, e.g., length, width, height, spacing, and the actual values of those parameters when the target is fabricated using a particular process. Examples of nominal process variation data include, but are not limited to, $n(\lambda)$ and $k(\lambda)$ for materials, height of resist or hard mask material, extent of residual topography, and signal insensitivity to overlay.

The inputs are provided to an optical simulator 108 that models acquisition of a metrology signal by a metrology tool. By way of example, the optical simulator 108 may computationally simulate an interaction between electromagnetic radiation and the target 1 and the metrology tool 10 using a model based on physical principles, e.g., Maxwell's equations and boundary conditions, which may be based on the inputs discussed above. The optical simulation may utilize information related to one or more metrology tool parameters 109 as inputs. Examples, of such parameters include parameters that characterize the optics in the tool 10 that couple probe radiation 22 from the source 20 to the target 1 and to couple radiation from the target 1 to the detector 40. Such parameters may include focal lengths, numerical apertures, transmissivities, reflectivities, and aberration coefficients. The metrology tool parameters 109 may also characterize the probe radiation, e.g., wavelength, polarization and intensity, the incident angle or range of incident angles with which the probe radiation 22 strikes the target 1. The metrology tool parameter 109 may also take into account the configuration of the light sensitive elements in the detector 40. In addition, the optical simulation 108 may take into account the nominal process variation data 106 to simulate variation in the optical behavior of the target design as the target structure varies due to variation in the process that forms the target. The optical simulation 108 generates one or more metrology characteristics 110 of the metrology structure 1 as an output. As used herein, the term metrology characteristics 110 generally refers to information related to a signal (e.g., an optical signal) that would be detected by a metrology tool as a result of an interaction between the metrology target structure and the metrology tool. By way of example, and not by way of limitation, in the case of a grating target 1 of the type shown in FIGS. 1A-1B, the metrology characteristics 110 may include a spectrum, e.g., a wavelength or angular reflection spectrum. In addition, the optical simulator 108 may output a metrology signal sensitivity to the metrology characteristics. By way of example, and not by way of limitation, in the case of a scatterometry tool, the metrology characteristics may include scattered wavelength, azimuthal angle, elevation angle or diffraction order.

The optical characteristics 110 of the target 1 may then be used as an input to a metrology simulator 112, which computationally simulates operation of a metrology tool (e.g., metrology tool 10) that uses the target 1. By way of example, and not by way of limitation, the metrology simulator 112 may compute an estimated signal measured by the detector 40 based on input assumptions including the optical characteristics 110 of the target 1 and the metrology recipe used to measure the target. The metrology recipe may include parameters relevant to the process used to extract a metrology measurement made with the target 1 using the tool 10 from the optical characteristics 110.

By way of example, and not by way of limitation, the metrology simulator 112 may analyze an angular or wavelength spectrum generated by the optical simulator and determine the angles or wavelengths corresponding to regions of maximum sensitivity to overlay in the spectrum and the relative intensity of those peaks. The results of the simulation may then be reviewed to determine domains in metrology characteristic space, e.g., in wavelength and angular (azimuthal and/or elevation) space, where the signal has a strong sensitivity to overlay. The metrology recipe may then be modified to weight wavelengths and/or angles within those domains more heavily. By weighting the metrology recipe towards wavelengths and/or angles for which the signal is particularly sensitive to overlay, the recipe may be optimized for high precision and sensitivity.

It is noted in a non-limiting way that multi-cell differential scatterometry overlay is known to be accurate only within a constrained dynamic range in which the differential signal is accurately modeled by a mathematical expression (e.g., a sine and cosine expansion) with a small number of coefficients. The number of coefficients is generally related to the number of cells in the metrology target and the number of cells is finite. By way of example, and not by way of limitation, the mathematical expression may have, e.g., between one and six coefficients. These coefficients may be modeled independently for each value of a scatterometric characteristic (e.g., scattering angle or wavelength) under the assumption that the magnitudes of higher coefficients are negligible. In theory, the mathematical expression may have a larger number of terms each with its own coefficient. To facilitate calculation, the metrology recipe used by the metrology tool ignores terms having coefficients that are negligible, e.g., below some threshold value. The metrology simulator 112 may therefore improve the accuracy of a scatterometry overlay measurement for a specific target design by selecting values of the characteristics (e.g., wavelength and/or angle (azimuthal or elevation) for which the higher order parameters are negligible. This may be accomplished by increasing the weight applied to the metrology contribution from each value of the metrology characteristics for which the magnitude of the higher coefficients are negligible and/or diminishing the weight of the metrology contribution from each value of the metrology characteristics for which the magnitude of the higher coefficients are not negligible.

The results of the simulated metrology recipe may drive an optimization loop 114 in which the result of the metrology simulation is compared with the input assumptions regarding the target and the input target design parameters 104 may be varied to optimize the target design. By way of example, and not by way of limitation, the metrology simulator 112 may compute an estimated offset between the two sets of lines 2, 4 in the target 1 based on a simulated diffraction from the two sets of lines. The estimated offset may be compared to an input value for the offset to determine an accuracy of the measurement. If the accuracy is less than optimal, the optimization loop 114 may vary the input design for the target 1 and feed the varied design back into the optical simulation 108 to produce a new optical characteristic 110, which is fed back to the metrology simulator 112. This process may iteratively repeat until the design for the target 1 is optimized.

Once the target design is optimized, the optimization loop 114 produces a number of outputs. These may include an optimized metrology target design 116, which may include optimized values of the metrology target parameters discussed above. The optimized target design 116 may be formatted for storage and/or display according to a suitable standard format, such as the GDS II stream format. The optimization loop may also produce an accuracy and precision estimation 118 over the space of process variation. Furthermore, the optimization loop 114 (or the metrology simulator 112) may produce metrology recipe optimization data 120, which may include optimized values of weights to be applied to metrology contributions from different metrology characteristics, as discussed above.

Figure 3:
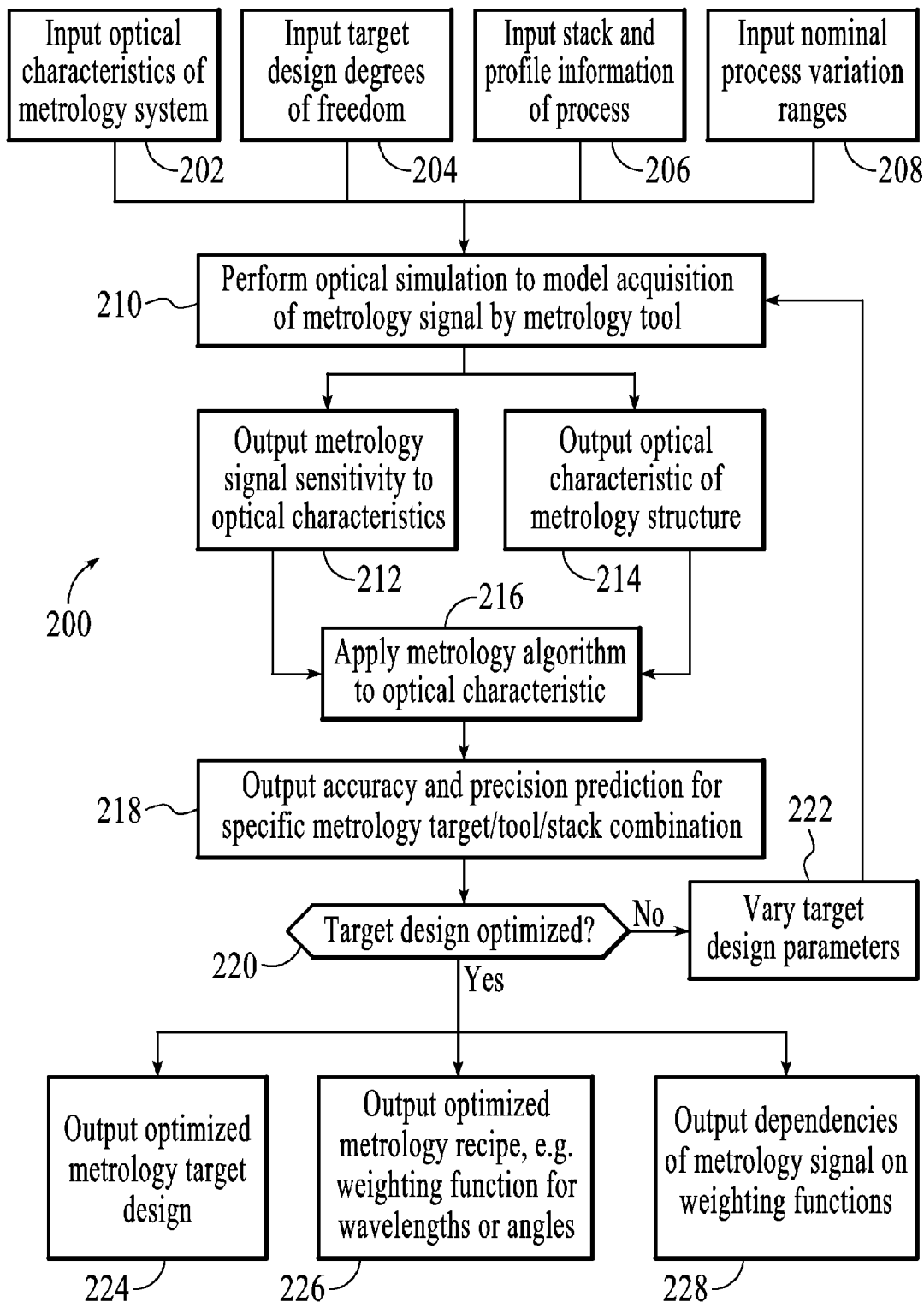
FIG. 3 is a flow diagram of a method for optimizing a metrology target in accordance with an embodiment of the present invention.

One possible method 200 for implementing metrology target design in accordance with an embodiment of the present invention is illustrated in the flow diagram shown in FIG. 3. This method may be implemented by computer software. Computer readable instructions for implementing the method 200 may be embodied in a computer readable medium, such as a computer memory, e.g., RAM, SRAM, DRAM, or ROM, or in a data storage medium, e.g., a disk, tape, CD-ROM and the like. Data for optical and metrology simulation may be input by a user or may be loaded from one or more data storage devices. This data may include optical characteristics of the metrology system 202, target design degrees of freedom 204, stack and profile information 206 and nominal process variation ranges 208. This information may be used to perform an optical simulation as indicated at 210. The optical simulation models acquisition of a metrology signal by a particular metrology tool. The optical simulation 210 generates one or more optical characteristics of a metrology structure as indicated at 212. For example, in the case of a grating target of the type shown in FIGS. 1A-1B, the optical characteristic may be a wavelength or angular reflection spectrum. In addition, the optical simulation 210 may output a metrology signal sensitivity to the optical characteristics, as indicated at 214.

The optical characteristics and (optionally) the signal sensitivity may be applied to a metrology algorithm as indicated at 216. The metrology algorithm then outputs an estimated accuracy and precision prediction for specific metrology target/tool/stack combination as indicated at 218. By way of example, the metrology algorithm may predict an offset determined from the wavelength or angular reflection spectrum. The accuracy of the offset prediction may be determined by comparing the predicted offset to an input value in the in the target design information. The precision of this prediction may be compared by determining the variation in the predicted offset over the process variation range.

At 220, a determination may be made as to whether the target design is optimized. The accuracy and precision for the metrology target/tool/stack combination may be compared to a desired accuracy and precision. If the design is not optimized, the target design parameters may be varied, as indicated at 222 and the optical simulation 210 and metrology target algorithm 216 may be repeated using the new design parameters to produce a new accuracy and precision. This process may be iteratively repeated until the target design is optimized.

Once the target design is optimized, a number of outputs may be generated. The may include an optimized metrology target design 224, an optimized metrology recipe 226, e.g. weighting function for wavelengths or angles, and dependencies of metrology signal on weighting functions 228.

Figure 4:
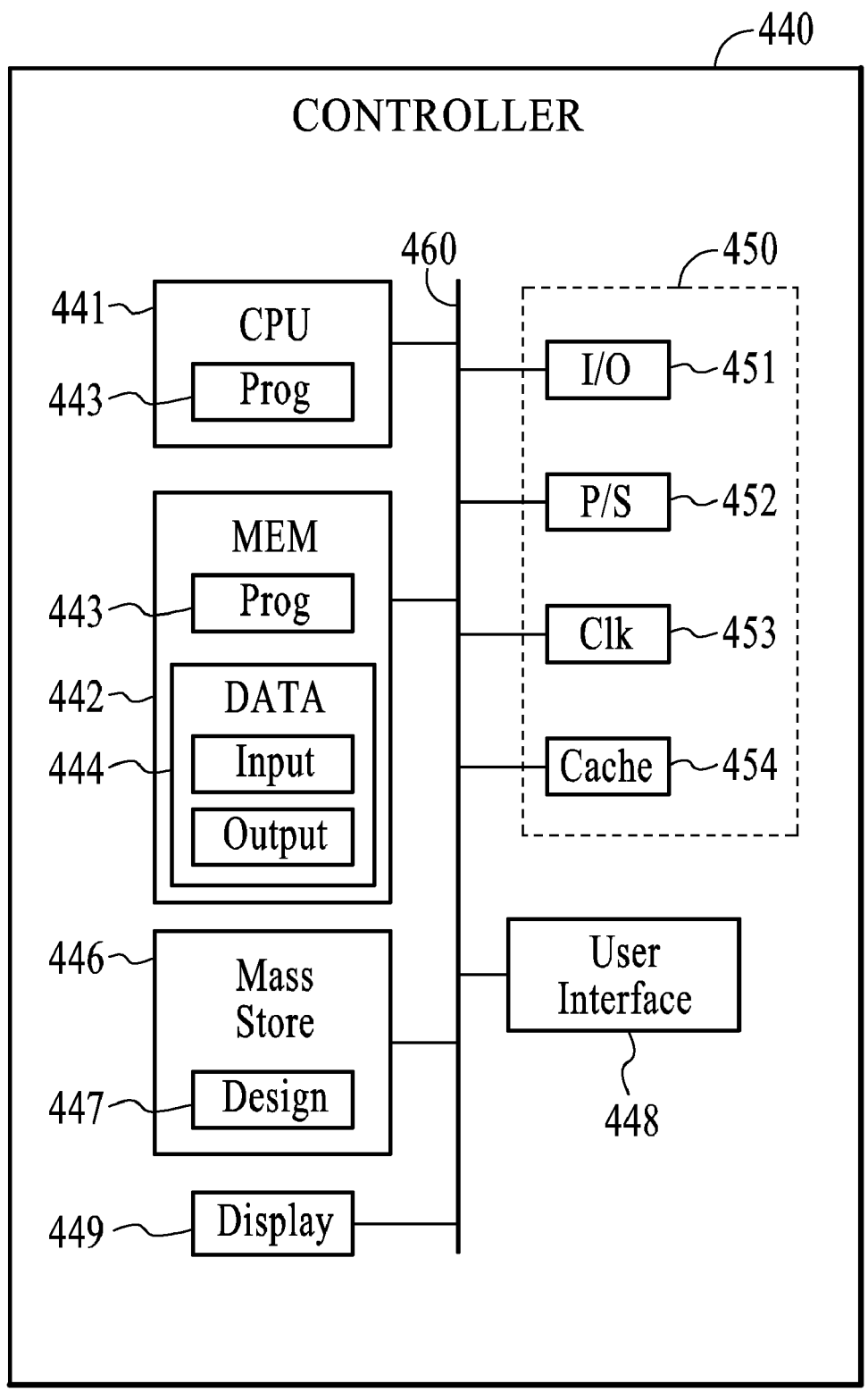
FIG. 4 is a block diagram illustrating a metrology design optimization apparatus according to an embodiment of the present invention.

FIG. 4 illustrates a metrology design optimization apparatus 440 according to an embodiment of the present invention. The apparatus 440 includes a central processor unit (CPU) 441 and a memory 442 (e.g., RAM, DRAM, ROM, and the like). The CPU 441 may execute a program 443, portions of which may be stored in the memory 442. The memory 442 may include data 444 used by or generated by the program 443. By way of example, the program 443 may be configured to implement the method 100. Specifically, the program 443 may include instructions that, when executed, implement a method of the type described above. Specifically, the instructions may, when executed may cause the processor unit 441 to a) receive input including information relating to a metrology target design, a substrate on which the target is to be formed, and a metrology system that will be used to measure the metrology target; b) model acquisition of a metrology signal with the metrology system using the metrology target information to generate one or more characteristics of the metrology target; c) apply a metrology algorithm to the characteristics of the metrology target to determine a predicted accuracy and precision of measurements made with the metrology system using the metrology target on the substrate; d) modify at least a portion of the information relating to the metrology target design and repeat b) and c) to optimize the target; and e) display or store information representing the optimized metrology target design.

By way of example the data 444 may include inputs for the program 443 such as metrology target design data, data relating to optical characteristics of a metrology system, stack and profile information of a process, and nominal process variation ranges. The data 444 may also include outputs from the program 443, such as an optimized metrology target design, an optimized metrology target recipe (e.g., weighting functions for wavelengths or angles) and dependencies of a metrology signal on weighting functions. The controller 440 may optionally include a mass storage device 446 such as a disk drive, CD-ROM drive, tape drive, or the like to store programs and/or data. By way of example, the mass storage device may be used to store the optimized metrology target design 447 produced by the program 443. The optimized target design 447 may be formatted according to a suitable format for storage and/or display, such as GDSII. The controller 440 may also include well-known support circuits 450, such as input/output (I/O) circuits 451, power supplies (P/S) 452, a clock (CLK) 453 and cache 454. The controller 440 may also optionally include a user interface unit 448 and display unit 449 to facilitate interaction between the controller 440 and a user. The display unit 449 may be in the form of a cathode ray tube (CRT) or flat panel screen that displays text, numerals, or graphical symbols. The user interface 448 may include a keyboard, mouse, joystick, light pen or other device. The preceding components may exchange signals with each other via an internal bus 460. The controller 440 may be a general purpose computer that becomes a special purpose computer when running code that implements embodiments of the present invention as described herein.

Embodiments of the present invention can reduce the cycle time to reach an optimal metrology target design and further more can improve peak target performance in terms of accuracy and dynamic range.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. In the claims that follow, the word "or" is to be interpreted as an inclusive "or"; e.g., A or B is satisfied if either A or B individually is present and alternatively satisfied if both A and B are present. The appended claims are not to be interpreted as including means-plus-function limitations, unless such a limitation is explicitly recited in a given claim using the phrase "means for."

What is claimed is:

1. A method for optimizing a metrology target design, comprising:
   a) receiving inputs including information relating to the metrology target design, information relating to a substrate on which a metrology target is to be formed, information relating to a process used to form the metrology target, or information relating to a metrology system to be used to measure the metrology target;
   b) modeling acquisition of a metrology signal by the metrology system using the inputs to generate one or more optical characteristics of the metrology target;
   c) applying a metrology algorithm to the one or more optical characteristics to determine a predicted accuracy and precision of one or more measurements made with the metrology system using the metrology target on the substrate;
   d) modifying at least a portion of the information relating to the metrology target design;
   d') modeling acquisition of a metrology signal with the metrology system, applying a metrology algorithm to the one or more optical characteristics, and modifying at least a portion of the information relating to the metrology target design to optimize the accuracy and precision of the one or more measurements; and
   e) displaying or storing information representing the metrology target design after the accuracy and precision are optimized.

2. The method of claim 1, wherein the metrology target is an overlay target.

3. The method of claim 2, wherein the metrology target is a differential scatterometry overlay target.

4. The method of claim 3, wherein the metrology target is a multi-cell differential scatterometry overlay target.

5. The method of claim 1, wherein modeling acquisition of the metrology signal with the metrology system includes determining one or more domains in metrology characteristic space for which the metrology signal has a strong sensitivity to overlay and modifying a metrology recipe to weight characteristics within those domains more heavily.

6. The method of claim 1, wherein modeling acquisition of the metrology signal with the metrology system includes modeling the acquisition of the metrology signal with a mathematical formula having a finite number of coefficients, and increasing a weight applied to a metrology contribution from one or more values of metrology characteristics for which a magnitude of higher coefficients are negligible and/or diminishing a weight of a metrology contribution from one or more values of metrology characteristics for which the magnitude of the higher coefficients are not negligible.

7. The method of claim 1, wherein applying a metrology algorithm to the one or more optical characteristics includes determining a metrology signal sensitivity from the characteristics of the metrology target.

8. The method of claim 1, wherein repeating applying a metrology algorithm to the one or more optical characteristics and modifying at least a portion of the information relating to the metrology target design to optimize the accuracy and precision of the one or more measurements includes storing the information representing the metrology target in a standard format for integrated circuit design.

9. The method of claim 1, wherein the information relating to the metrology target design includes one or more design parameters of the target design.

10. The method of claim 1, wherein the information relating to the metrology target design includes one or more target design degrees of freedom.

11. The method of claim 1, wherein the information relating to a substrate on which the target is to be formed includes stack and profile information related to one or more layers of material on the substrate.

12. The method of claim 1, wherein the information relating to the process used to form the metrology target includes process variation data related to the process used to form the target.

13. The method of claim 1, wherein the information relating to a metrology system to be used to measure the metrology target includes one or more parameters that characterize optics used by the metrology tool, probe radiation used by the metrology tool, or a detector used by the metrology tool.

14. The method of claim 1, wherein the optical characteristic includes a simulated spectrum of radiation scattered by the metrology target.

15. The method of claim 14, wherein applying the metrology algorithm to the one or more optical characteristics includes comparing one or more features of the simulated spectrum to one or more corresponding features of one or more spectra associated with predetermined metrology measurement values.

16. An apparatus for optimizing a metrology target design, comprising:
   a) an optical simulator configured to receive inputs including information relating to the metrology target design, information relating to a substrate on which a metrology target is to be formed, information relating to a process used to form the metrology target, or information relating to a metrology system to be used to measure the metrology target, wherein the optical simulator is further configured to model acquisition of a metrology signal with the metrology system using the inputs to generate one or more optical characteristics of the metrology target;
   b) a metrology simulator configured to apply a metrology algorithm to the optical characteristics to determine a predicted accuracy or precision of measurements made with the metrology system using the metrology target on the substrate; and c) an optimization loop configured to modify at least a portion of the information relating to the metrology target design to optimize the design to produce an optimized metrology target design, wherein the optimization loop optimizes the predicted accuracy and precision of the one or more measurements by repeatedly i) models acquisition of a metrology signal by the metrology system using the inputs to generate one or more optical characteristics of the metrology target, ii) applies a metrology algorithm to the one or more optical characteristics to determine a predicted accuracy and precision of one or more measurements made with the metrology system using the metrology target on the substrate, and iii) modifies at least a portion of the information relating to the metrology target design.

17. The apparatus of claim 16, further comprising a display, configured to display the information representing the optimized metrology target design.

18. The apparatus of claim 16, further comprising a data storage device, configured to store information representing the optimized metrology target design.

19. The apparatus of claim 16, wherein the optimization loop is configured to produce metrology recipe optimization data.

20. The apparatus of claim 19, wherein the metrology recipe optimization data includes one or more values of weights to be applied to metrology contributions from one or more corresponding metrology characteristics.

21. The apparatus of claim 16, wherein the optimization loop is configured to produce metrology recipe optimization data.

22. The apparatus of claim 21, wherein the metrology recipe optimization data includes one or more dependencies of the metrology signal on one or more weighting functions.

23. The apparatus of claim 16, wherein the optimization loop is configured to produce an estimation of accuracy of precision of the measurements made with the metrology system over a space of process variation.

24. An apparatus for optimizing a metrology target design comprising:
   a processor;
   a memory;
   instructions embodied in the memory for execution by the processor, the instructions being configured to optimize a metrology target upon execution by the processor, the instructions comprising:
   a) instructions for receiving inputs including information relating to the metrology target design, information relating to a substrate on which the metrology target is to be formed, information relating to a process used to form the metrology target, and information relating to a metrology system to be used to measure the metrology target;
   b) instructions for modeling acquisition of a metrology signal with the metrology system using the inputs to generate one or more optical characteristics of the metrology target;
   c) instructions for applying a metrology algorithm to the one or more optical characteristics to determine a predicted accuracy and precision of one or more measurements made with the metrology system using the metrology target on the substrate;
   d) instructions for modifying at least a portion of the information relating to the metrology target design;
   d') instructions for repeating the instructions for modeling acquisition of a metrology signal with the metrology system, applying a metrology algorithm to the one or more optical characteristics, and modifying at least a portion of the information relating to the metrology target design to optimize the accuracy and precision of the one or more measurements; and
   e) instructions for displaying or storing information representing the metrology target relating to the metrology target design after the accuracy and precision are optimized.

25. A non-transitory computer readable medium having computer readable instructions embodied therein, the instructions being configured to implement a method for optimizing a metrology target upon execution by the processor, the method comprising:
   a) receiving inputs including information relating to the metrology target design, information relating to a substrate on which the metrology target is to be formed, information relating to a process used to form the metrology target, and information relating to a metrology system to be used to measure the metrology target;
   b) modeling acquisition of a metrology signal with the metrology system using the inputs to generate one or more optical characteristics of the metrology target;
   c) applying a metrology algorithm to the one or more optical characteristics to determine a predicted accuracy and precision of one or more measurements made with the metrology system using the metrology target on the substrate;
   d) modifying at least a portion of the information relating to the metrology target design;
   d') repeating modeling acquisition of a metrology signal, applying a metrology algorithm to the one or more optical characteristics and modifying at least a portion of the information relating to the metrology target design to optimize the accuracy and precision of the one or more measurements; and
   e) displaying or storing information representing the metrology target design after the accuracy and precision are optimized.

* * * * *